United States Patent
Thadani et al.

(10) Patent No.: US 9,362,107 B2
(45) Date of Patent: Jun. 7, 2016

(54) FLOWABLE LOW-K DIELECTRIC GAPFILL TREATMENT

(71) Applicant: Applied Materials, Inc., Santa Clara, CA (US)

(72) Inventors: Kiran V. Thadani, Sunnyvale, CA (US); Abhijit Basu Mallick, Fremont, CA (US); Sanjay Kamath, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/502,492

(22) Filed: Sep. 30, 2014

(65) Prior Publication Data

US 2016/0093488 A1 Mar. 31, 2016

(51) Int. Cl.
*H01L 21/02* (2006.01)
*H01L 21/762* (2006.01)
*H01L 21/768* (2006.01)

(52) U.S. Cl.
CPC .... *H01L 21/02126* (2013.01); *H01L 21/02216* (2013.01); *H01L 21/02274* (2013.01); *H01L 21/02348* (2013.01); *H01L 21/02351* (2013.01); *H01L 21/76224* (2013.01); *H01L 21/76837* (2013.01)

(58) Field of Classification Search
None
See application file for complete search history.

(56) References Cited

U.S. PATENT DOCUMENTS

| | | | |
|---|---|---|---|
| 5,186,745 A | 2/1993 | Maniar | |
| 5,461,010 A | 10/1995 | Chen et al. | |
| 6,630,390 B2 | 10/2003 | Andideh et al. | |
| 6,858,195 B2 | 2/2005 | Aronowitz et al. | |
| 6,992,024 B2 | 1/2006 | Cui et al. | |
| 7,902,080 B2 | 3/2011 | Chen et al. | |
| 2002/0128388 A1 | 9/2002 | Kennedy et al. | |
| 2004/0152342 A1 | 8/2004 | Li et al. | |
| 2007/0281106 A1 | 12/2007 | Lubomirsky et al. | |
| 2007/0281448 A1 | 12/2007 | Chen et al. | |
| 2008/0132087 A1 | 6/2008 | Xia et al. | |
| 2009/0104755 A1 | 4/2009 | Mallick et al. | |
| 2009/0104789 A1 | 4/2009 | Mallick et al. | |
| 2009/0104790 A1 | 4/2009 | Liang | |
| 2011/0111137 A1 | 5/2011 | Liang et al. | |
| 2012/0003840 A1 | 1/2012 | Wang et al. | |
| 2012/0083133 A1 | 4/2012 | Solis et al. | |
| 2012/0149213 A1* | 6/2012 | Nittala | C23C 16/02 438/783 |
| 2012/0238108 A1 | 9/2012 | Chen et al. | |
| 2013/0230987 A1* | 9/2013 | Draeger | H01L 21/02126 438/694 |
| 2014/0017895 A1* | 1/2014 | Chan | H01L 21/3065 438/694 |

* cited by examiner

*Primary Examiner* — Yasser A Abdelaziez
(74) *Attorney, Agent, or Firm* — Kilpatrick Townsend & Stockton LLP

(57) ABSTRACT

Methods are described for forming a flowable low-k dielectric film on a patterned substrate. The film may be a silicon-carbon-oxygen (Si—C—O) layer in which the silicon and carbon constituents come from a silicon and carbon containing precursor while the oxygen may come from an oxygen-containing precursor activated in a remote plasma region. Shortly after deposition, the silicon-carbon-oxygen layer is treated by exposure to a hydrogen-and-nitrogen-containing precursor such as ammonia prior to curing. The treatment may remove residual moisture from the silicon-carbon-oxygen layer and may make the lattice more resilient during curing and subsequent processing. The treatment may reduce shrinkage of the silicon-carbon-oxygen layer during subsequent processing.

14 Claims, 5 Drawing Sheets

FLOWABLE LOW-K DIELECTRIC GAPFILL TREATMENT

FIELD

Embodiments of the invention relate to flowably depositing low-k dielectric into substrate gaps.

BACKGROUND

The miniaturization of semiconductor circuit elements has reached a point where feature sizes of 28 nm, 22 nm, and even 14 nm are fabricated on a commercial scale. As the dimensions continue to get smaller, new challenges arise for process steps like filling a gap between circuit elements with a dielectric material that avoids electrical cross-talk. As the width between the elements continues to shrink, the gap between them often gets taller and narrower, making the gap difficult to fill without the dielectric material getting stuck to create voids or weak seams. Conventional chemical vapor deposition (CVD) techniques often experience an overgrowth of material at the top of the gap before it has been completely filled. This can create a void or seam in the gap where the depositing dielectric material has been prematurely cut off by the overgrowth; a problem sometimes referred to as breadloafing.

One solution to the breadloafing problem has been to use liquid precursors for the dielectric starting materials that more easily flow into the gaps. A technique currently in commercial use for doing this is called spin-on-glass (SOG). More recently, techniques have been developed that impart flowable characteristics to dielectric materials deposited by CVD. These techniques can deposit flowable precursors to fill a tall, narrow gap while reducing an incidence of creating voids or weak seams. While the new flowable CVD techniques represent a significant breakthrough in filling tall, narrow (i.e., high-aspect ratio) gaps with dielectric materials such as silicon oxide, there is still a need for techniques that can seamlessly fill such gaps with low-k dielectric materials. The present application addresses this need by describing flowable CVD techniques for forming silicon-and-carbon containing dielectric materials on a substrate.

SUMMARY

Methods are described for forming a flowable low-k dielectric film on a patterned substrate. The film may be a silicon-carbon-oxygen (Si—C—O) layer in which the silicon and carbon constituents come from a silicon and carbon containing precursor while the oxygen may come from an oxygen-containing precursor activated in a remote plasma region. Shortly after deposition, the silicon-carbon-oxygen layer is treated by exposure to a hydrogen-and-nitrogen-containing precursor such as ammonia prior to curing. The treatment may remove residual moisture from the silicon-carbon-oxygen layer and may make the lattice more resilient during curing and subsequent processing. The treatment may reduce shrinkage of the silicon-carbon-oxygen layer during subsequent processing.

Embodiments of the invention include methods of processing a low-k dielectric film. The methods include forming a silicon-carbon-oxygen film on a substrate. The silicon-carbon-oxygen film includes silicon, carbon and oxygen. The methods further include exposing the silicon-carbon-oxygen film to an atmosphere comprising a hydrogen-and-nitrogen-containing precursor. The methods further include exposing the silicon-carbon-oxygen film to at least one of UV-light or an electron beam after exposing the silicon-carbon-oxygen film to the atmosphere comprising the hydrogen-and-nitrogen-containing precursor.

Embodiments of the invention include methods of filling a trench. The methods include transferring a patterned substrate including the trench into a substrate processing region of a substrate processing chamber. The methods further include flowing an oxygen-containing precursor into a remote plasma region while igniting a remote plasma to form a radical-oxygen precursor. The methods further include flowing a silicon-and-carbon-containing precursor into the substrate processing region without first passing the silicon-and-carbon-containing precursor through any plasma. The methods further include flowing the radical-oxygen precursor into the substrate processing region. The methods further include combining the silicon-and-carbon-containing precursor and the radical-oxygen precursor in the substrate processing region to form a low-k dielectric film on the patterned substrate. A portion of the low-k dielectric film deposits on the patterned substrate and flows along a surface of the patterned substrate during formation of the low-k dielectric film to fill the trench. The methods further include flowing a hydrogen-and-nitrogen-containing precursor into the substrate processing region to treat the patterned substrate and form a treated low-k dielectric film.

Embodiments of the invention include methods of filling a trench. The methods include transferring a patterned substrate comprising the trench into a substrate processing region of a substrate processing chamber. The methods further include flowing molecular oxygen into a remote plasma region while igniting a remote plasma to form plasma effluents. The methods further include flowing the plasma effluents into the substrate processing region through through-holes in a showerhead disposed and forming a border between the remote plasma region and the substrate processing region. The methods further include flowing a silicon-and-carbon-containing precursor into the substrate processing region without first passing the silicon-and-carbon-containing precursor through any plasma. The silicon-and-carbon-containing precursor has a Si—O:Si ratio of less than 3. The methods further include combining the silicon-and-carbon-containing precursor and the plasma effluents in the substrate processing region to form a low-k dielectric film on the patterned substrate. The methods further include flowing ammonia into the substrate processing region to treat the patterned substrate and form a treated low-k dielectric film. The substrate processing region is devoid of plasma. The methods further include curing the treated low-k dielectric film by exposure to ultraviolet light.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DESCRIPTION OF THE DRAWINGS

A further understanding of the nature and advantages of the present invention may be realized by reference to the remaining portions of the specification and the drawings.

DETAILED DESCRIPTION

Methods are described for forming a flowable low-k dielectric film on a patterned substrate. The film may be a silicon-carbon-oxygen (Si—C—O) layer in which the silicon and carbon constituents come from a silicon and carbon containing precursor while the oxygen may come from an oxygen-containing precursor activated in a remote plasma region. Shortly after deposition, the silicon-carbon-oxygen layer is treated by exposure to a hydrogen-and-nitrogen-containing precursor such as ammonia prior to curing. The treatment may remove residual moisture from the silicon-carbon-oxygen layer and may make the lattice more resilient during curing and subsequent processing. The treatment may reduce shrinkage of the silicon-carbon-oxygen layer during subsequent processing.

Low-k dielectric materials are achieved by inserting pores within films and/or selecting materials which naturally exhibit lower-k. Low-k dielectric materials can be prone to shrinking especially when the temperature of the patterned substrate is raised during post-deposition processing. An ammonia treatment (or another suitable hydrogen-and-nitrogen-containing precursor) following deposition may be removing components (e.g. moisture) in a controlled manner while stabilizing the crystal lattice in preparation for subsequent processing. Low-k dielectric films produced using the techniques presented herein may exhibit much less shrinkage during post-deposition processing and during the lifespan of the semiconductor devices produced. Reduced shrinkage benefits the operation of the semiconductor device by (1) reducing cross-talk between conducting elements and (2) providing greater physical stability which increases production yield. Some nitrogen from the hydrogen-and-nitrogen-containing precursor may be added to the low-k layer during treatment, but the concentration may be very low which enables the dielectric constant of the low-k layer to remain low.

Figure 1:
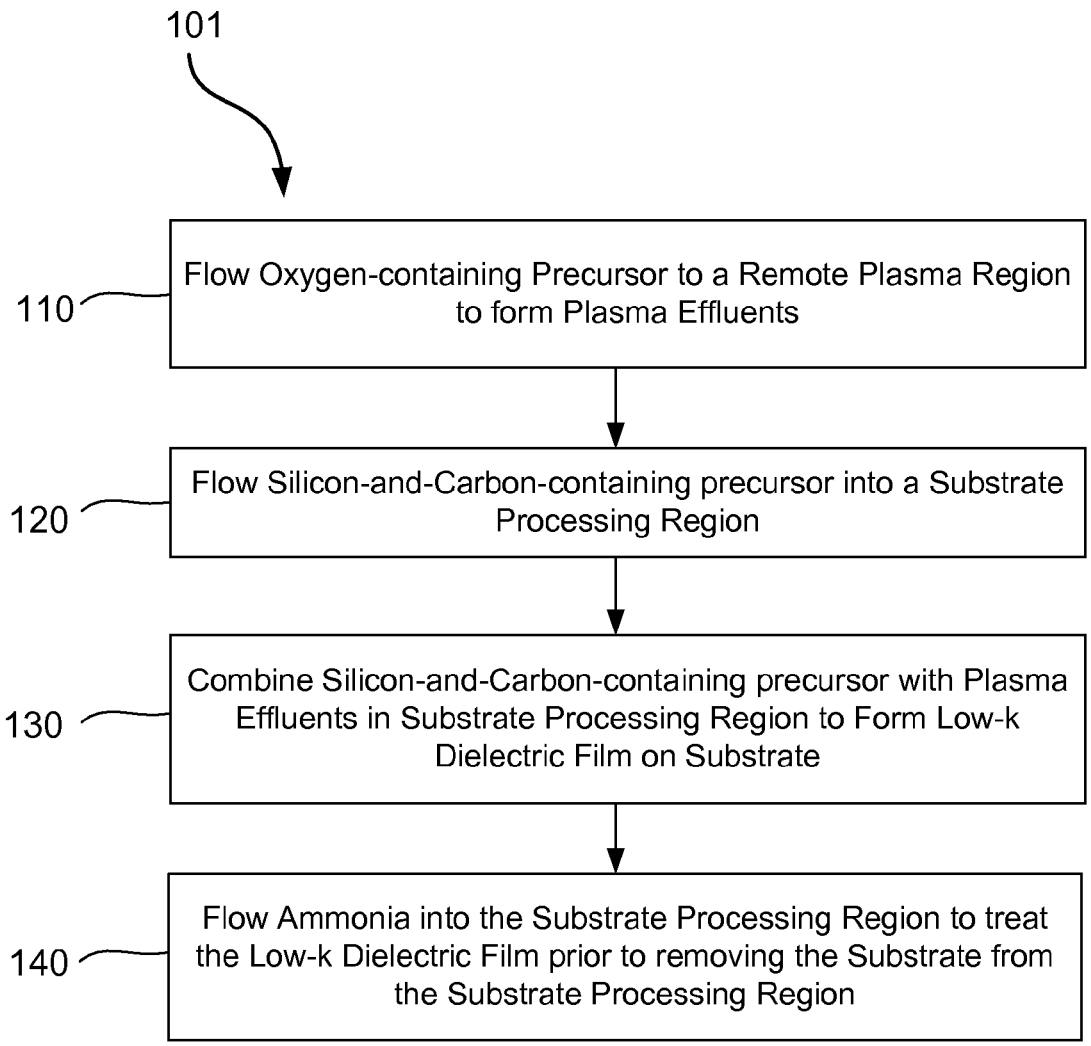
FIG. 1 is a flowchart illustrating selected steps in a method of forming a gapfill low-k dielectric film on a substrate according to embodiments.

In order to better understand and appreciate the invention, reference is now made to FIG. 1 which is a flowchart illustrating selected steps in a method 101 of forming a gapfill low-k dielectric film on a substrate according to embodiments. An oxygen-containing precursor is flowed into a remote plasma in a remote plasma region to form plasma effluents in operation 110. The oxygen-containing precursor is energized in the remote plasma formed in a remote plasma system (RPS) positioned outside the substrate processing chamber and/or a remote plasma region within the substrate processing chamber but partitioned from the substrate processing region by a restriction such as a showerhead. The oxygen-containing precursor may be excited in a remote plasma. In the remote plasma (regardless of position), the oxygen-containing precursor may be dissociated, radicalized, and/or otherwise transformed into the radical-oxygen precursor within the plasma effluents. For example, when the source of oxygen-containing precursor is $O_2$, radical-oxygen precursor may include one or more of .O, .$O_2$, $O_3$, and oxygen radicals. The radical-oxygen precursor is then flowed through a restriction, such as a showerhead, into a substrate processing region. Independently, a silicon-and-carbon-containing precursor is flowed into the substrate processing region in operation 120. The radical-oxygen precursor may mix for the first time with the silicon-and-carbon-containing precursor in the substrate processing region (operation 130). The silicon-and-carbon-containing precursor has not flowed through any plasma prior to entering the substrate processing region according to embodiments. The combination of the radical-oxygen precursor and the silicon-and-carbon-containing precursor in the vicinity of the patterned substrate forms a flowable low-k dielectric film (e.g. a flowable silicon-carbon-oxygen film) on the patterned substrate. The flowable low-k dielectric film may flow on the substrate during deposition to facilitate filling restricted geometries even at low substrate temperatures.

The oxygen-containing precursor may include one or more of ozone ($O_3$), molecular oxygen ($O_2$), atomic oxygen (O), NO, $N_2O$, and $NO_2$. The oxygen-containing precursor may be accompanied by one or more additional gases such a hydrogen ($H_2$), nitrogen ($N_2$), helium, neon, argon according to embodiments. The plasma effluents comprise a radical-oxygen precursor which is defined as any oxygen-containing components having at least one unpaired electron. The radical-oxygen precursor may contribute some or all of the oxygen constituent in the deposited low-k film which may be a silicon-carbon-oxygen film in embodiments. According to some embodiments, the oxygen-precursor may be nitrogen-free to promote the formation of flowable and relatively low-k dielectric gapfill. The flowable low-k dielectric film may flow on the surface during deposition at the low substrate temperatures described herein to help fill trenches in the patterned substrate. Similarly, the remote plasma region may be devoid of nitrogen (e.g. no nitrogen ($N_2$)) in order to promote the formation of the low-k dielectric according to embodiments. For example, the oxygen-containing precursor may include ozone, molecular oxygen and atomic oxygen in embodiments. In this case, the radical-oxygen (a component of the plasma effluents) will also be nitrogen-free. The silicon-carbon-oxygen film may be nitrogen-free in embodiments. The oxygen-precursor may also contain carbon that provides at least some of the carbon for the deposited silicon-carbon-oxygen layer according to embodiments.

The silicon-and-carbon-containing precursor may further contain oxygen. The silicon-and-carbon-containing precursor may possess a Si—O to Si ratio of 1 or less than 3 according to embodiments. These ratios correlate with the production of flowable low-k dielectric films using the methods described herein. The Si—O to Si ratio is calculated by counting the number of Si—O bonds in the precursor and dividing by the number of silicon atoms in the precursor. For example, the silicon-and-carbon-containing precursor may be octamethylcyclotetrasiloxane or tetramethylcyclotetrasiloxane, which each have a Si—O:Si ratio of 1, and have been found to correlate with an increased degree of flowability and a decreased dielectric constant. In embodiments, the silicon-and-carbon-containing precursor may be nitrogen-free to enable the production of nitrogen-free low-k dielectric.

An additional silicon-and-carbon-containing precursor may be combined with the silicon-and-carbon-containing precursor to tune the properties of the flowable low-k dielectric film according to embodiments. The second silicon-and-carbon-containing precursor may possess a Si—O to Si ratio of 4 or greater than 2 in embodiments. These ratios correlate with production of a less flowable, less low-k but greater strength film. Stronger films may have greater bulk modulus or a greater shear modulus according to embodiments compared to films made with a higher concentration of Si—O: Si=1 or Si—O:Si=2 precursors. The second silicon-and-carbon-containing precursor may be tetramethyl orthosilicate, which has a Si—O:Si ratio of 4.

The flowability of the initially-deposited silicon-carbon-oxygen layer may be due to a variety of properties which result from mixing an radical oxygen precursor with the silicon-and-carbon-containing precursor. These properties may include a significant carbon content and/or a significant hydrogen content in the initially-deposited silicon-carbon-oxygen layer. The flowability does not rely on a high substrate temperature, therefore, the initially-flowable silicon-carbon-and-oxygen-containing layer may fill gaps during deposition even on relatively low temperature substrates. The temperature of the substrate during operation 130 may be less than 150° C., less than 120° C., less than 100° C. or between 65° C. and 95° C. in embodiments. The pressure in the substrate processing region may be about 0.1 Torr to about 10 Torr (e.g., about 0.5 to about 6 Torr, etc.) during the deposition of the low-k dielectric or silicon-carbon-oxygen film in operation 130. The initially flowable silicon-carbon-oxygen layer may be deposited on exposed planar surfaces a well as into gaps whose penetration is enabled by flowing nature of the low-k dielectric film during deposition. The thickness of the low-k dielectric film (the silicon-carbon-oxygen layer) may be greater than 50 Å, greater than 100 Å, greater than 150 Å, greater than 250 Å or greater than 350 Å according to embodiments. The silicon-carbon-oxygen layer may consist of silicon, carbon and oxygen or may consist of silicon, carbon, oxygen and hydrogen, in embodiments. The silicon-carbon-oxygen layer is nitrogen-free in embodiments. All film properties and process parameters given for this example also apply to subsequent examples according to embodiments.

When the flowable silicon-carbon-oxygen layer reaches a desired thickness, the process effluents may be removed from the substrate-processing region and/or the flow of radical-oxygen into the substrate processing region may be stopped. These process effluents may include any unreacted oxygen-containing and silicon-and-carbon-containing precursors, diluent and/or carrier gases, and reaction products that did not deposit on the substrate. The process effluents may be removed by evacuating the substrate processing region and/or displacing the effluents with non-deposition gases in the substrate processing region. The carbon content (on an atomic percentage basis) of the silicon-carbon-oxygen layer may be greater than 5% or greater than 8% in embodiments. In a preferred embodiment, the atomic percentage of carbon content is greater than 10% which further increases the flowability of initially-flowable silicon-carbon-oxygen films. The oxygen content (on an atomic percentage basis) of the silicon-carbon-oxygen layer may be greater than 5% greater than 8% or greater than 10% in embodiments.

The oxygen containing precursor may be flowed into the remote plasma region at a flow rate between 10 sccm and 4000 sccm, between 200 sccm and 3000 sccm, or between 500 sccm and 2000 sccm in embodiments. The silicon-and-carbon-containing precursor may be supplied in the form of a gas or a liquid. The silicon-and-carbon-containing precursor may be flowed directly into the substrate processing region at a flow rate between 10 sccm and 4000 sccm, between 200 sccm and 3000 sccm, or between 1200 sccm and 2000 sccm according to embodiments. The silicon-and-carbon-containing precursor may be flowed directly into the substrate processing region (with the assistance of a carrier gas) at a flow rate between 0.1 milligrams per minute and 2000 milligrams per minute, between 0.3 milligrams per minute and 1000 milligrams per minute or between 0.5 milligrams per minute and 100 milligrams per minute in embodiments.

The patterned substrate is treated by flowing ammonia into the substrate processing region to react with the low-k dielectric film in operation 140. The substrate processing region may be devoid of plasma (may be plasma-free) during operation 140 in embodiments. The ammonia may not be passed through any plasma en route to the substrate processing region according to embodiments. The treated film has been found to shrink less and retain more physical strength than an untreated otherwise-similar film. The treatment may be making a subsequent cure with ultraviolet light or an electron beam more effective. Curing low-k dielectric films has traditionally been responsible for removing undesirable components and cross-linking the remaining matrix to establish a rigid material lattice. The ammonia treatment of operation 140 may be removing the undesirable components such that a subsequent cure may more simply cross-link the remaining matrix without simultaneous removal of material.

During the treatment, the ammonia may be flowed into and through the remote plasma region into the substrate processing region during operation 140, in which case both the remote plasma region and the substrate processing region may contain little or no plasma according to embodiments. The remote plasma region and the substrate processing region may be plasma-free in embodiments. Alternatively, the ammonia may be flowed directly into the substrate processing region by-passing the remote plasma region. The remote plasma region and/or the substrate processing region may contain little or no plasma or be plasma-free in embodiments.

The low-k dielectric film (e.g. the silicon-carbon-oxygen film) may contain no elements other than silicon, carbon, hydrogen and oxygen prior to the treatment operation (operation 140 or operation 220 in a subsequent description) in embodiments. The silicon-carbon-oxygen film may contain no elements other than silicon, carbon, nitrogen, hydrogen and oxygen following operation 140 or operation 220 according to embodiments.

Generally speaking, a hydrogen-and-nitrogen-containing precursor may be used during the treatment operation. The hydrogen-and-nitrogen-containing precursor may include one or more of ammonia and hydrazine. The hydrogen-and-nitrogen-containing precursor may consist only of hydrogen and nitrogen according to embodiments. During the treatment (operation 140) the substrate processing region may be devoid of oxygen in embodiments. The substrate processing region may be devoid of moisture, according to embodiments, during operation 140.

The hydrogen-and-nitrogen-containing precursor may be flowed into the substrate processing region at a flow rate between 10 sccm and 4000 sccm, between 200 sccm and 3000 sccm, or between 300 sccm and 2000 sccm in embodiments. The temperature of the substrate during operation 140 may be less than 150° C., less than 120° C., less than 100° C. or between 65° C. and 95° C. in embodiments. The pressure in the substrate processing region may be about 0.1 Torr to about 10 Torr (e.g., about 0.5 to about 6 Torr, etc.) during the treatment operation applied to the low-k dielectric or silicon-carbon-oxygen film in operation 140.

Figure 2:
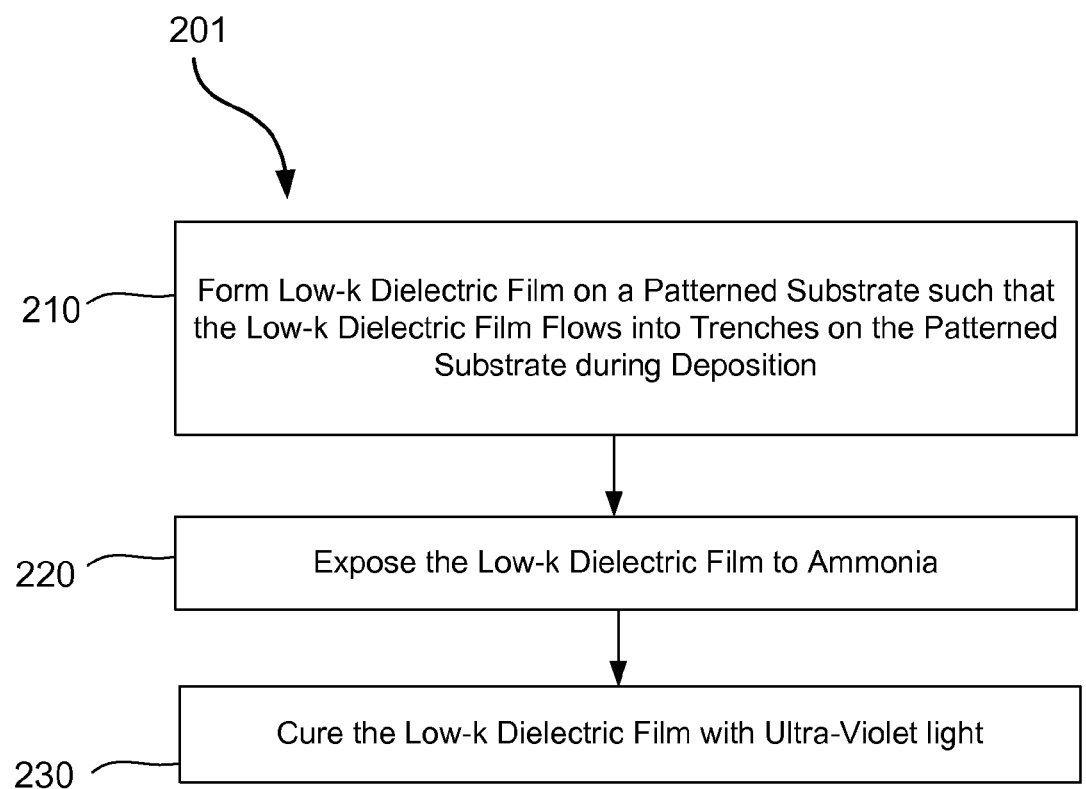
FIG. 2 is a flowchart illustrating selected steps in a method of forming a gapfill low-k dielectric film on a substrate according to embodiments.

Reference will now be made to FIG. 2 which is a flowchart illustrating selected steps in a method 201 of forming a gapfill low-k dielectric film on a substrate according to embodiments. Flow rates, pressures, temperatures, thicknesses and film properties may have the same quantities described for the previous example and may not be repeated here. A flowable low-k dielectric film is formed on a patterned substrate in operation 210. The flowable low-k dielectric film flows on the patterned substrate surface during deposition at the low substrate temperatures described herein. The flowing nature of the low-k dielectric film allows material to redistribute from high regions having higher probability of receiving material from a deposition source to the interior of trenches on the patterned substrate surface.

The patterned substrate is then exposed to an environment containing ammonia in operation 220 (the treatment operation). The pressure in the environment may be about 1 Torr and may be devoid of moisture and may be devoid of oxygen according to embodiments. The environment surrounding the low-k dielectric film may be chemically inert other than the ammonia or another hydrogen-and-nitrogen-containing precursor in embodiments. The patterned substrate may be in the same substrate processing region for both operation 210 and operation 220. Performing both operations in the same substrate processing region is conducive to a rapid treatment quickly succeeding deposition. Treating the patterned substrate quickly following deposition has been found to be more effective even in cases where the patterned substrate is maintained under "vacuum". Alternatively, operation 210 and operation 220 may be performed in separate substrate processing regions on the same substrate processing mainframe and vacuum may not be broken during the time between the two operations according to embodiments. Of course, the generalizations previously described for ammonia also apply to this example.

The patterned substrate may not be exposed to external atmosphere (atmosphere from the cleanroom outside a semiconductor processing mainframe or chamber) from the operation of transferring the patterned substrate all the way through to the operation of flowing ammonia into the substrate processing region to treat the patterned substrate according to embodiments.

The patterned substrate is then cured (operation 230) by, for example, exposing the patterned substrate to ultraviolet light or to an electron beam (e-beam) according to embodiments. As described previously, the presence of treatment operation 220 reduces the responsibilities of curing operation 230. The presence of both operations in the described sequence has been found to result in a low-k dielectric layer which exhibits substantially less shrinkage in subsequent processing.

For all the examples presented herein, the flowably deposited low-k dielectric film is solidified after the formation of the film. The solidification may involve curing, annealing and/or simply waiting for solidification to occur. Curing may involve exposing the patterned substrate to ultraviolet light (UV light) or an electron beam ("e-beam illumination"). In the trench of a completed device, the low-k dielectric film may have a dielectric constant of between 2.2 and 3.0, between 2.4 and 2.8 or between 2.5 and 2.7 according to embodiments. In the case where a liner low-k dielectric film is included to promote flowability, both the liner low-k dielectric film and the bulk low-k dielectric film are included as gapfill and the contributions of both are included for determining the dielectric constant.

The gaps and trenches filled using the techniques described herein may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths below 32 nm, below 28 nm, below 22 nm or below 16 nm according to embodiments.

Any or all of the deposition methods described herein may have a low electron temperature in the substrate processing region during the deposition to increase flowability and/or maintain a low dielectric constant according to embodiments. Techniques may therefore be used to reduce the electron temperature using an ion suppressor and/or a showerhead. The plasma effluents including the radical-oxygen precursor flow through the showerhead and/or the ion suppressor from the remote plasma region to the substrate processing region. In embodiments, an ion suppressor (which may be the showerhead) may be used to provide radical and/or neutral species for deposition. The ion suppressor may also be referred to as an ion suppression element. In embodiments, for example, the ion suppressor is used to filter plasma effluents (including radical-oxygen) en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are simply one way to achieve a low electron temperature in the substrate processing region during the low-k dielectric deposition and/or the silicon oxide liner deposition described above.

The electron temperature may be measured using a Langmuir probe in the substrate processing region during excitation of a plasma in the remote plasma. In embodiments, the electron temperature may be less than 0.5 eV, less than 0.45 eV, less than 0.4 eV, or less than 0.35 eV. These extremely low values for the electron temperature are enabled by the presence of the showerhead and/or the ion suppressor. Uncharged neutral and radical species may pass through the openings in the showerhead/ion suppressor to react at the substrate. Such a process using radicals and other neutral species can reduce plasma damage compared to conventional deposition processes that include sputtering and bombardment.

Introducing alternative nomenclature, the substrate processing region may be described herein as "plasma-free" during the deposition processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region are hard to define and may encroach upon the substrate processing region through the apertures in the showerhead. Furthermore, a low intensity plasma may be created in the substrate processing region without eliminating desirable features of the deposition processes described herein. All causes for a plasma having much lower intensity ion density than the chamber plasma region during the creation of the excited plasma effluents do not deviate from the scope of "plasma-free" as used herein.

Figure 3:
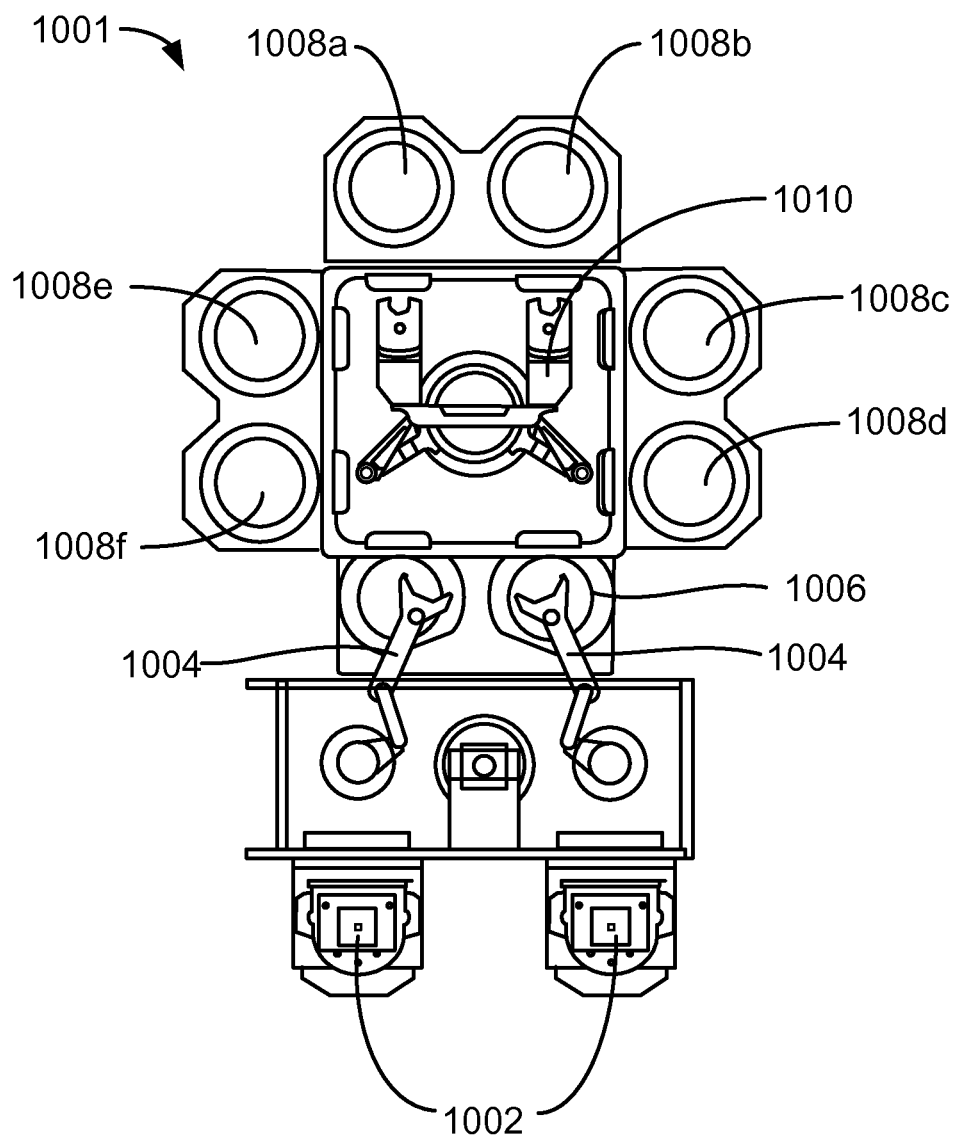
FIG. 3 shows a substrate processing system according to embodiments of the invention.

Embodiments of substrate processing chambers which perform the methods presented herein may be incorporated into a substrate processing system for producing integrated circuit chips. FIG. 3 shows an exemplary processing system 1001 for deposition and curing chambers according to embodiments. FOUPs (front opening unified pods) 1002 supply substrates by way of robotic arms 1004 into low pressure holding areas 1006. A second robotic arm 1010 may be used to transport the substrate wafers from holding areas 1006 to substrate processing chambers 1008*a-f* and back.

Substrate processing chambers 1008*a-f* may be configured to deposit or perform a variety of treatments on the deposited layer(s). In one configuration, two pairs of the processing chamber (e.g., 1008*c-d* and 1008*e-f*) may be used to deposit the flowable dielectric material on the substrate, and the third pair of processing chambers (e.g., 1008a-b) may be used to cure the dielectric material using ultraviolet or e-beam illumination.

Figure 4A:
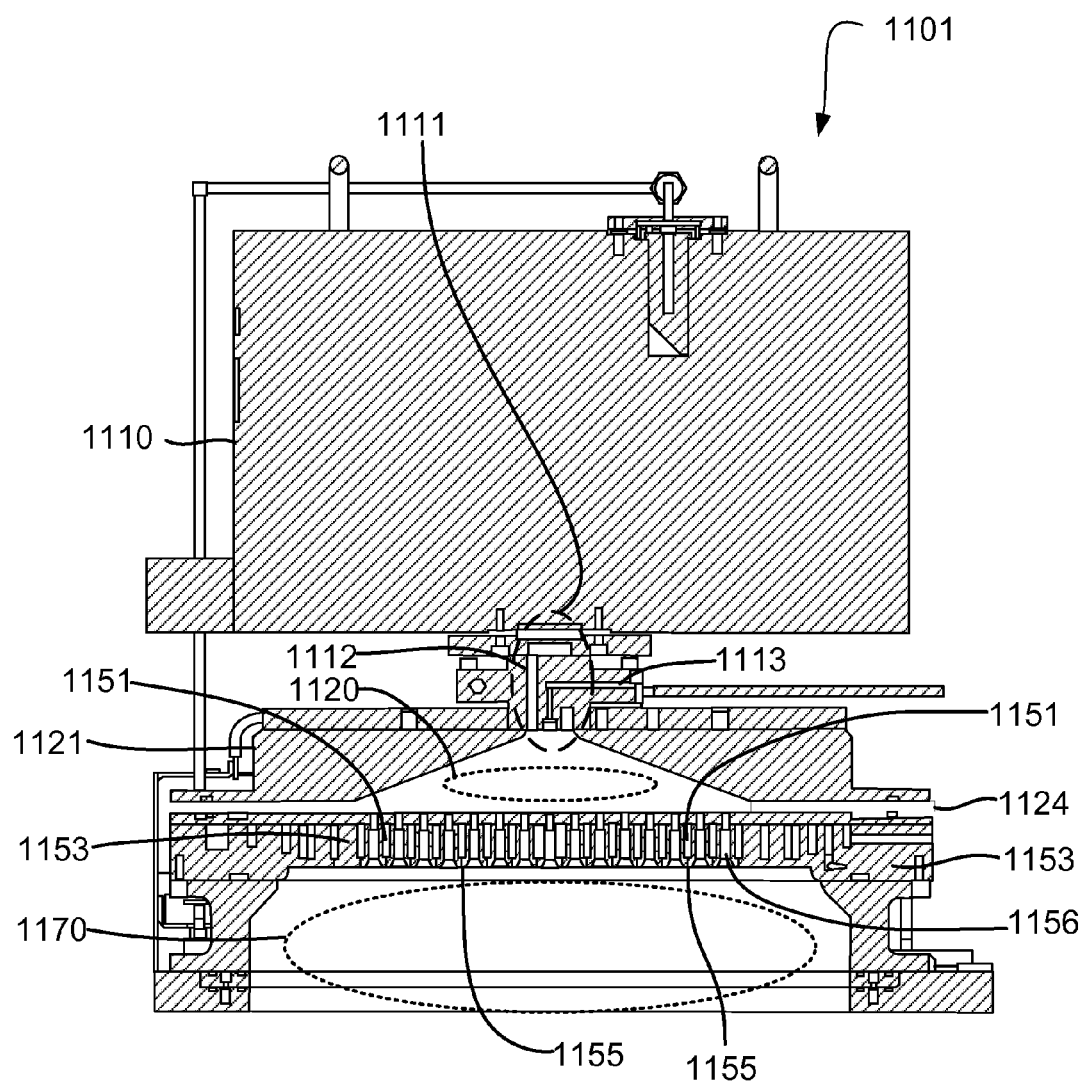
FIG. 4A shows a substrate processing chamber according to embodiments of the invention.

FIG. 4A is a substrate processing chamber 1101 according to embodiments. A remote plasma system (RPS) 1110 may process a gas which then travels through a gas inlet assembly 1111. Two distinct gas supply channels are visible within the gas inlet assembly 1111. A first channel 1112 carries a gas that passes through the remote plasma system (RPS) 1110, while a second channel 1113 bypasses the RPS 1110. The first channel 1112 may be used for the process gas and the second channel 1113 may be used for a treatment gas in embodiments. The lid (or conductive top portion) 1121 and a perforated partition 1153 are shown with an insulating ring 1124 in between, which allows an AC potential to be applied to the lid 1121 relative to perforated partition 1153. The process gas travels through first channel 1112 into chamber plasma region 1120 and may be excited by a plasma in chamber plasma region 1120 alone or in combination with RPS 1110. The combination of chamber plasma region 1120 and/or RPS 1110 may be referred to as a remote plasma system herein. The perforated partition (also referred to as a showerhead) 1153 separates chamber plasma region 1120 from a substrate processing region 1170 beneath showerhead 1153. Showerhead 1153 allows a plasma present in chamber plasma region 1120 to avoid directly exciting gases in substrate processing region 1170, while still allowing excited species (plasma effluents) to travel from chamber plasma region 1120 into substrate processing region 1170.

Showerhead 1153 is positioned between chamber plasma region 1120 and substrate processing region 1170 and allows plasma effluents (excited derivatives of precursors or other gases) created within chamber plasma region 1120 to pass through a plurality of through holes 1156 that traverse the thickness of the plate. The showerhead 1153 also has one or more hollow volumes 1151 which can be filled with a precursor in the form of a vapor or gas (such as a silicon-and-carbon-containing precursor) and pass through small holes 1155 into substrate processing region 1170 but not directly into chamber plasma region 1120.

In the embodiment shown, showerhead 1153 may distribute (via through holes 1156) process gases which contain oxygen and/or plasma effluents of process gases upon excitation by a plasma in chamber plasma region 1120. In embodiments, the process gas introduced into the RPS 1110 and/or chamber plasma region 1120 through first channel 1112 may contain one or more of oxygen ($O_2$), ozone ($O_3$), $N_2O$, NO, and $NO_2$. However, the oxygen-containing precursor may be devoid of nitrogen, the remote plasma region may be devoid of nitrogen, and the resulting Si—O—C film may commensurately be devoid of nitrogen, in embodiments. The process gas may also include a carrier gas such as helium, argon, nitrogen ($N_2$), etc. The second channel 1113 may also deliver a process gas and/or a carrier gas, and/or a film-curing gas (e.g. $O_3$) used to remove an unwanted component from the growing or as-deposited film. Plasma effluents may include ionized or neutral derivatives of the process gas and may also be referred to herein as a radical-oxygen precursor referring to the atomic constituent of the process gas introduced.

Figure 4B:
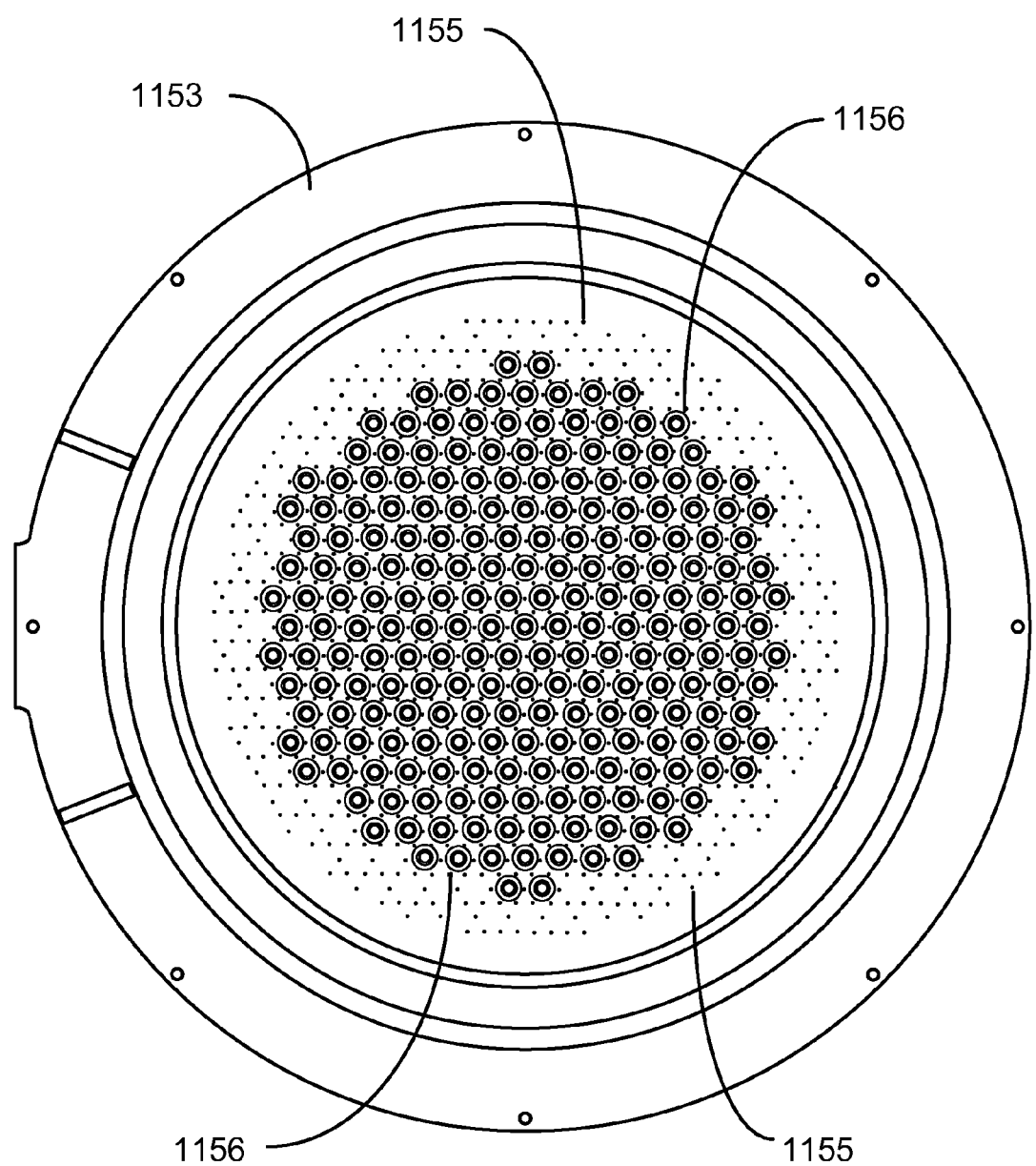
FIG. 4B shows a gas distribution showerhead according to embodiments of the invention.

FIG. 4B is a bottom view of a showerhead 1153 for use with a processing chamber according to embodiments. Showerhead 1153 corresponds with the showerhead shown in FIG. 4A. Through-holes 1156 are depicted with a larger inner-diameter (ID) on the bottom of showerhead 1153 and a smaller ID at the top. Small holes 1155 are distributed substantially evenly over the surface of the showerhead, even amongst the through-holes 1156 which helps to provide more even mixing.

An exemplary film is created on a substrate supported by a pedestal (not shown) within substrate processing region 1170 when plasma effluents arriving through through-holes 1156 in showerhead 1153 combine with a silicon-and-carbon-containing precursor arriving through the small holes 1155 originating from hollow volumes 1151. Though substrate processing region 1170 may be equipped to support a plasma for other processes such as curing, no plasma is present during the growth of the exemplary film. The pedestal may be configured to cool or heat a supported substrate to maintain relatively low temperatures (from room temperature through about 120° C.).

A plasma may be ignited either in chamber plasma region 1120 above showerhead 1153 or substrate processing region 1170 below showerhead 1153. A plasma is present in chamber plasma region 1120 to produce the radical-oxygen precursor from an inflow of an oxygen-containing gas. An AC voltage typically in the radio frequency (RF) range is applied between the conductive top portion 1121 of the processing chamber and showerhead 1153 to ignite a plasma in chamber plasma region 1120 during deposition. An RF power supply generates a high RF frequency of 13.56 MHz but may also generate other frequencies alone or in combination with the 13.56 MHz frequency. Exemplary RF frequencies include microwave frequencies such as 2.4 GHz. The remote plasma power may be greater than or about 1000 watts, greater than or about 2000 watts, greater than or about 3000 watts or greater than or about 4000 watts in embodiments, during deposition of the flowable film.

The remote plasma may be left at low or no power when the bottom plasma in the substrate processing region 1170 is turned on during the second curing stage or clean the interior surfaces bordering substrate processing region 1170. A plasma in substrate processing region 1170 is ignited by applying an AC voltage between showerhead 1153 and the pedestal or bottom of the chamber. A cleaning gas may be introduced into substrate processing region 1170 while the plasma is present.

The substrate processing system is controlled by a system controller. A process for depositing a film stack (e.g. sequential deposition of a silicon-oxygen-and-hydrogen-containing layer and then a silicon-oxygen-and-carbon-containing layer) on a substrate, converting a film to silicon oxide or a process for cleaning a chamber can be implemented using a computer program product that is executed by the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. A "radical-oxygen precursor" is a radical precursor which contains oxygen and may be nitrogen-free in embodiments. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" or "trench" are used throughout with no implication that the etched geometry has a large horizontal aspect ratio. Viewed from above the surface, gaps and trenches may appear circular, oval, polygonal, rectangular, or a variety of other shapes. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of processing a low-k dielectric film, the method comprising:
    forming a silicon-carbon-oxygen film on a substrate, wherein the silicon-carbon-oxygen film comprises silicon, carbon and oxygen;
    exposing the silicon-carbon-oxygen film to an atmosphere comprising a hydrogen-and-nitrogen-containing precursor;
    exposing the silicon-carbon-oxygen film to at least one of UV-light or an electron beam after exposing the silicon-carbon-oxygen film to the atmosphere comprising the hydrogen-and-nitrogen-containing precursor, wherein the atmosphere comprising the hydrogen-and-nitrogen-containing precursor is devoid of oxygen.

2. The method of claim 1 wherein the hydrogen-and-nitrogen-containing precursor consists only of hydrogen and nitrogen.

3. The method of claim 1 wherein the silicon-carbon-oxygen film contains no elements other than silicon, carbon, hydrogen and oxygen prior to the operation of exposing the silicon-carbon-oxygen film to an atmosphere comprising a hydrogen-and-nitrogen-containing precursor.

4. The method of claim 1 wherein the silicon-carbon-oxygen film contains no elements other than silicon, carbon, nitrogen, hydrogen and oxygen following the operation of exposing the silicon-carbon-oxygen film to an atmosphere comprising a hydrogen-and-nitrogen-containing precursor.

5. The method of claim 1 wherein a temperature of the substrate while exposing the silicon-carbon-oxygen film to the atmosphere comprising the hydrogen-and-nitrogen-containing precursor is less than 150° C.

6. A method of filling a trench, the method comprising:
    transferring a patterned substrate comprising the trench into a substrate processing region of a substrate processing chamber;
    flowing an oxygen-containing precursor into a remote plasma region while igniting a remote plasma to form a radical-oxygen precursor;
    flowing a silicon-and-carbon-containing precursor into the substrate processing region without first passing the silicon-and-carbon-containing precursor through any plasma;
    flowing the radical-oxygen precursor into the substrate processing region;
    combining the silicon-and-carbon-containing precursor and the radical-oxygen precursor in the substrate processing region to form a low-k dielectric film on the patterned substrate, wherein a portion of the low-k dielectric film deposits on the patterned substrate and flows along a surface of the patterned substrate during formation of the low-k dielectric film to fill the trench; and
    flowing a hydrogen-and-nitrogen-containing precursor into the substrate processing region to treat the patterned substrate and form a treated low-k dielectric film.

7. The method of claim 6 wherein the low-k dielectric film has a dielectric constant of between 2.2 and 3.0 in the trench of a completed device.

8. The method of claim 6 wherein the silicon-and-carbon-containing precursor possesses a Si—O to Si ratio of less than 3.

9. The method of claim 6, wherein the silicon-and-carbon-containing precursor possesses a Si—O to Si ratio of 1.

10. The method of claim 6 further comprising an operation of curing the treated low-k dielectric film by exposing the treated low-k dielectric film to one or both of UV light and e-beam radiation.

11. The method of claim 6 wherein the silicon-and-carbon-containing precursor is octamethylcyclotetrasiloxane or tetramethylcyclotetrasiloxane.

12. A method of filling a trench, the method comprising:
    transferring a patterned substrate comprising the trench into a substrate processing region of a substrate processing chamber;
    flowing molecular oxygen into a remote plasma region while igniting a remote plasma to form plasma effluents;
    flowing the plasma effluents into the substrate processing region through through-holes in a showerhead disposed and forming a border between the remote plasma region and the substrate processing region;

flowing a silicon-and-carbon-containing precursor into the substrate processing region without first passing the silicon-and-carbon-containing precursor through a plasma, wherein the silicon-and-carbon-containing precursor has a Si—O:Si ratio of less than 3;

combining the silicon-and-carbon-containing precursor and the plasma effluents in the substrate processing region to form a low-k dielectric film on the patterned substrate;

flowing ammonia into the substrate processing region to treat the patterned substrate and form a treated low-k dielectric film, wherein the substrate processing region is devoid of plasma; and curing the treated low-k dielectric film by exposure to ultraviolet light.

13. The method of claim 12 wherein the silicon-and-carbon-containing precursor has a Si—O:Si ratio of 1.

14. The method of claim 12 wherein the patterned substrate is not exposed to external atmosphere from transferring the patterned substrate to flowing ammonia into the substrate processing region to treat the patterned substrate.

* * * * *